US006763080B1

United States Patent
Higashino

(10) Patent No.: US 6,763,080 B1
(45) Date of Patent: Jul. 13, 2004

(54) SYNCHRONOUS SIGNAL PROCESSING SYSTEM

(75) Inventor: Kiminori Higashino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/565,490

(22) Filed: May 5, 2000

(30) Foreign Application Priority Data

May 14, 1999 (JP) .......................................... 11-134004

(51) Int. Cl.[7] .............................................. H03D 3/24
(52) U.S. Cl. ..................................... 375/376; 327/147
(58) Field of Search ................................. 375/376, 373, 375/374, 375, 354, 327, 294; 327/147, 156; 329/325; 712/10; 714/10

(56) References Cited

U.S. PATENT DOCUMENTS 6,141,769 A * 10/2000 Petivan et al. ................. 714/10
6,349,391 B1 * 2/2002 Petivan et al. ................. 714/11

FOREIGN PATENT DOCUMENTS

| JP | 2-217919 | 8/1990 |
|---|---|---|
| JP | 2-226824 | 9/1990 |
| JP | 4-140812 | 5/1992 |
| JP | 4-225408 | 8/1992 |
| JP | 5-313785 | 11/1993 |
| JP | 7-106958 | 4/1995 |
| JP | 7-281783 | 10/1995 |
| JP | 8-237214 | 9/1996 |
| JP | 9-34585 | 2/1997 |
| JP | 9-282042 | 10/1997 |
| JP | 10-313349 | 11/1998 |
| JP | 5-324868 | 12/1998 |
| JP | 11-41095 | 2/1999 |

* cited by examiner

Primary Examiner—Khai Tran
(74) Attorney, Agent, or Firm—McGinn & Gibb, PLLC

(57) ABSTRACT

A signal processing system includes a PLL circuit for generating a first clock signal based on a system clock signal, a CPU for generating a second clock signal based on the first clock signal and operating with the second clock signal. The PLL circuit receives the second clock signal as a feed-back signal to deliver the first clock signal so that the phases of the second clock signal and the system clock signal coincide with each other. A data path circuit operates with the system clock signal and UDL circuit operates with the second clock signal, whereby the system can be handled as a synchronous circuit operating with the single system clock signal.

6 Claims, 6 Drawing Sheets

SYNCHRONOUS SIGNAL PROCESSING SYSTEM

BACKGROUND OF THE INVENTION (a) Field of the Invention

The present invention relates to a synchronous signal processing system and, more particularly, to a technique for handling a signal processing system having a plurality of processors operating with different clock signals as a synchronous circuit operating with a single clock signal.

(b) Description of a Related Art

In view of feasibility of larger circuit scale, higher speed operation and circuit design for semiconductor devices, it is desired that a signal processing system including a plurality of processors operating with different clock signals be handled as a synchronous system operating with a single system clock signal.

FIG. 1 shows a timing chart of signals in a typical video signal processor, implemented as a video signal sampling circuit. The video signal sampling circuit samples a video signal based on a system clock signal. The sampled video signal is then supplied to a succeeding stage circuit together with the system clock signal for allowing the succeeding stage circuit to process the sampled video signal.

There is no substantial phase difference between the input clock signal and the output clock signal of the typical video signal sampling circuit. In this case, the signal processing system including the sampling circuit and succeeding signal processing circuits (referred to as data path circuits, hereinafter) for processing the output of the sampling circuit can be designed as a synchronous system operating with the single system clock signal.

In general, a CPU used in a signal processing system has a phase difference between the input clock signal and the output clock signal thereof, wherein the phase difference therebetween is not defined. FIG. 2 shows another timing chart of signals used in a signal processing system including a CPU. In the signal processing system, the timings of the signals are defined based on the output clock signal supplied from the CPU. Thus, if a plurality of CPUs or processors are disposed in a single system, the design for synchronization is difficult in the system.

Patent Publication JP-A-11-41095 describes a technique for adjusting the phase in a PLL circuit, which is thus indispensable to the system, as recited in the publication. Patent Publication JP-A-5-324868 describes another technique for adjustment of phases between the input clock signal and the output clock signal of a CPU.

Both the publications mentioned above describe techniques for use of a PLL circuit and for delivering a clock signal to the CPU, and do not refer to a synchronization design of a signal processing system including a plurality of CPUs or processors. FIG. 3 shows a conceivable example of a signal processing system implementing the techniques described in the above publications.

The signal processing system includes a data path circuit (processor) 11, a CPU 12, a system clock generator 17 for delivering a system clock signal f1, a PLL circuit for generating a first clock signal f3 in synchrony with the system clock signal f1 based on the system clock signal f1, a set of external interfaces 16, and a user data logic (UDL) block 14 for receiving/transmitting data using an internal bus. The CPU 12 receives the first clock signal f3 and delivers data together with a second clock signal f2 generated in the CPU 12.

The UDL block 14 includes a first UDL circuit 15A, a second UDL circuit 15B and a clock exchanger 18, and receives and transmits data from/to the external interface 16, the data path circuit 11 and the CPU 12 by using the first and second UDL circuits 15A and 15B. The first UDL circuit 15A receives/transmits data to the data path circuit 11 based on the first clock signal f3, whereas the second UDL circuit 15B receives/transmits data to the CPU 12 and external interface 16 based on the second-clock signal f2, the first and second clock signals f3 and f2 being exchanged by the clock exchanger 18. The data path circuit 11 uses the first clock signal f3 supplied from the PLL circuit 13.

The clock exchanger 18 receives the first and second clock signals f3 and f2 at terminals Ick1 and Ick2, and functions for exchanging the first and second clock signals Ick1 and Ixc2 for the UDL circuits 15A and 15B, whereby signal transmission of the data between the data path circuit 11 and the external interface 16 is operated on the first clock signal f3 and signal transmission of the data between the CPU 12 and the external circuit is operated on the second clock signal f2. The data path circuit 11 operates with the first clock signal f3 for data processing therein.

There is a disadvantage in the conventional signal processing system in that the presence of the clock exchanger 18 increases the circuit scale of the UDL block 14 and thus the circuit scale of the entire system. In addition, the asynchronous configuration of the signal processing system complicates development of a new product for the system during the circuit design and simulation thereof.

SUMMARY OF THE INVENTION

It is an object of the present invention to provide a signal processing system including a plurality of signal processors, such as CPU and data path circuit, which operate with different clock signals, which can be treated as a synchronous system operating with a single clock signal.

The present invention provides a signal processing system including a first processing unit for signal processing based on a system clock signal, a PLL circuit for generating a first clock signal based on the system clock signal, a second processing unit for generating a second clock signal based on the first clock signal and signal processing based on the second clock signal, wherein the PLL circuit receives the second clock signal as a feed-back signal to deliver the first clock signal so that a phase difference between the system clock signal and the second clock signal assumes zero.

In accordance with the signal processing system of the present invention, since the phase difference between the system clock signal and the second clock signal assumes zero, the signal processing system including the first and second processing units can be handled as a synchronous circuit which operates with the single system clock signal, without using a clock exchanger.

The above and other objects, features and advantages of the present invention will be more apparent from the following description, referring to the accompanying drawings.

PREFERRED EMBODIMENTS OF THE INVENTION

Figure 1:
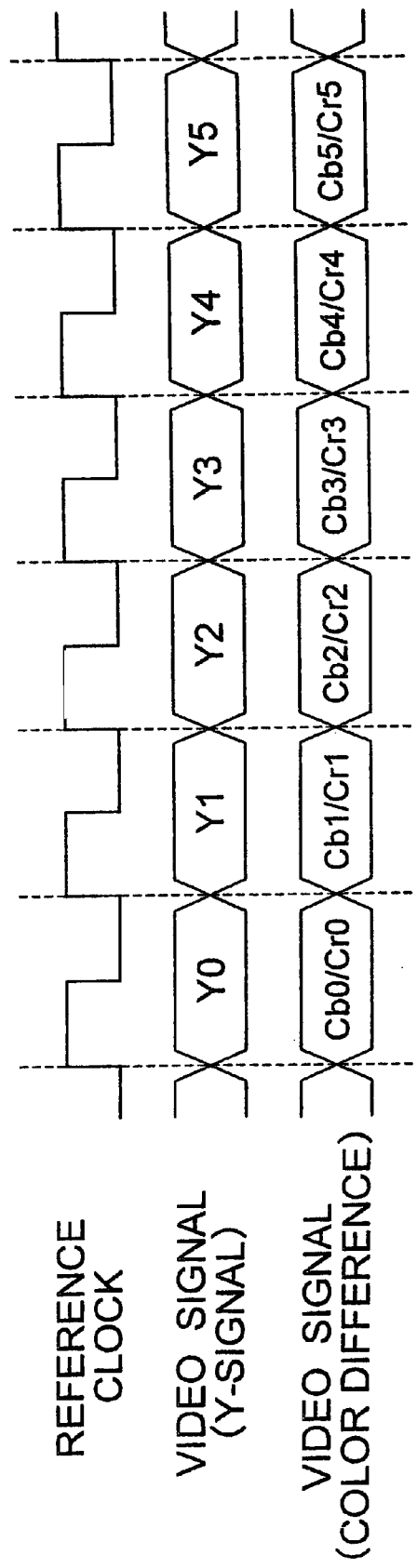
FIG. 1 is a timing chart of a conventional signal processing system for processing a video signal.
Figure 2:
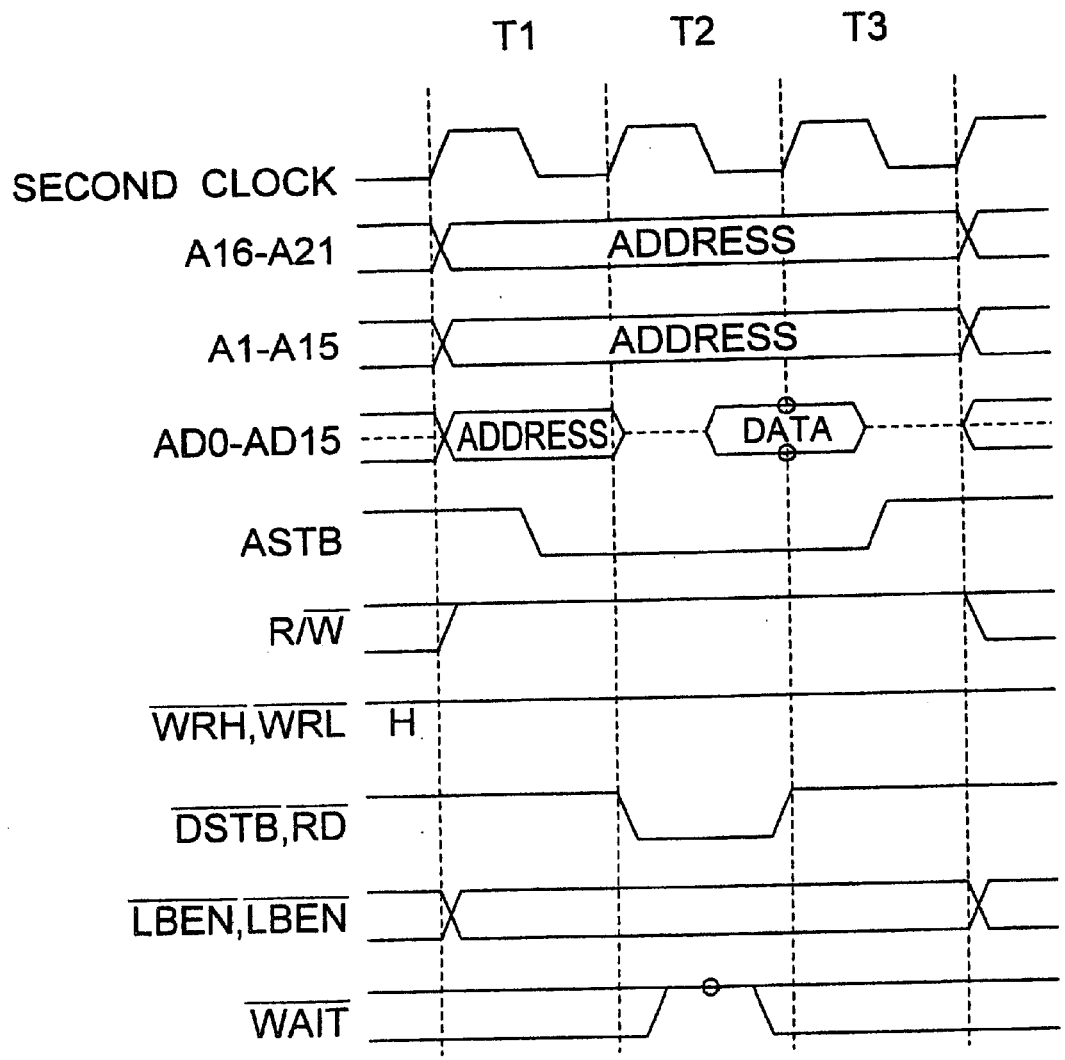
FIG. 2 is a timing chart of a conventional signal processing system having a plurality of processors operating with different clock signals.
Figure 3:
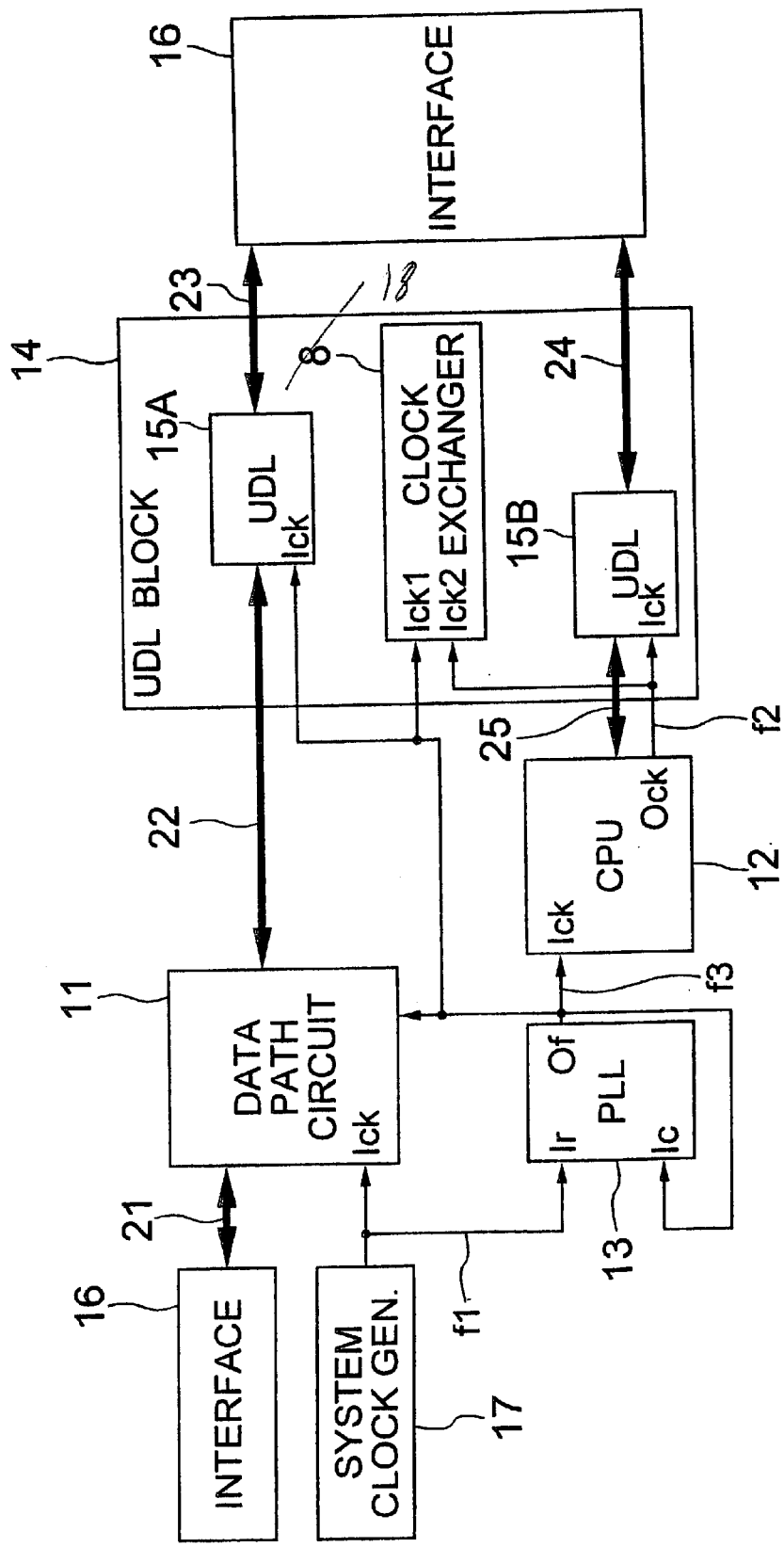
FIG. 3 is a block diagram of a conceivable signal processing system having a plurality of processors and formed by using the techniques described in patent publications.

Now, the present invention is more specifically described with reference to accompanying drawings, wherein similar constituent elements are designated by similar reference numerals.

Figure 4:
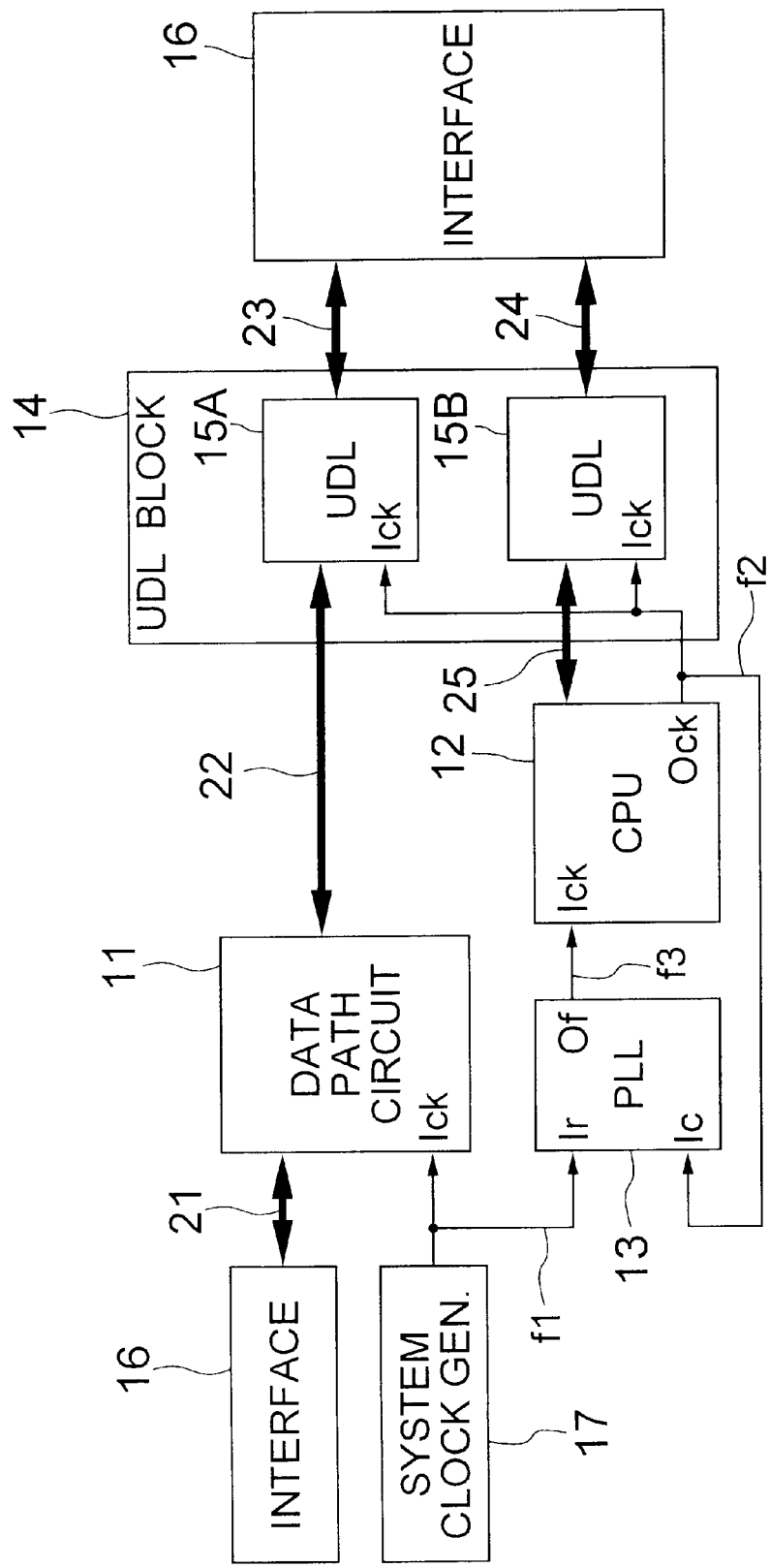
FIG. 4 is a block diagram of a signal processing system according to a first embodiment of the present invention.

Referring to FIG. 4, a signal processing system according to a first embodiment of the present invention includes a data path circuit 11 as a first processor, a CPU (CPU core) 12 as a second processor, a system clock generator 17 for delivering a system clock signal f1, a PLL circuit 13 for generating a first clock signal f3 based on the system clock signal f1, a set of external interfaces 16, a UDL block 14 as a third processor for receiving/transmitting data, and data buses 21 to 25 for data transmission.

The UDL block 14 includes first UDL circuit 15A and a second UDL circuit 15B, and operates for data transmission between the data path circuit 11 or the CPU 12 and the external interface 16 through the data bus by using the first and second UDL circuits 15A and 15B. The first and second UDL circuits 15A and 15B operate with the second clock signal f2 received at the clock inputs Ick of the UDL circuits 15A and 15B. The data path circuit 11 operates with the system clock signal f1 supplied from the system clock generator 17.

The system clock generator 17 delivers the system clock signal f1 to the PLL circuit 13 at the clock input Ir thereof, and to the data path circuit 11 at the clock input Ick thereof. The PLL circuit 13 generates the first clock signal f3 and delivers the same to the CPU 12. The CPU 12 receives the first clock signal f3 and delivers data together with a second clock signal f2 generated in the CPU 12 based on the first clock signal f3.

The PLL circuit 13 receives the system cock signal f1 at the clock input Ir thereof, and also the second clock signal f2 at the feed-back input Ic thereof. The PLL circuit 13 oscillates at a frequency same as the frequency of the system clock signal f1 to deliver, through the output Ock thereof, the second clock signal f2 which is controlled for skew adjustment with the system clock signal f1. The skew adjustment between the system clock signal f1 and the second clock signal f2 allows the UDL block 14 to operate with the second clock signal f2 in synchrony with the system clock signal f1.

Figure 5:
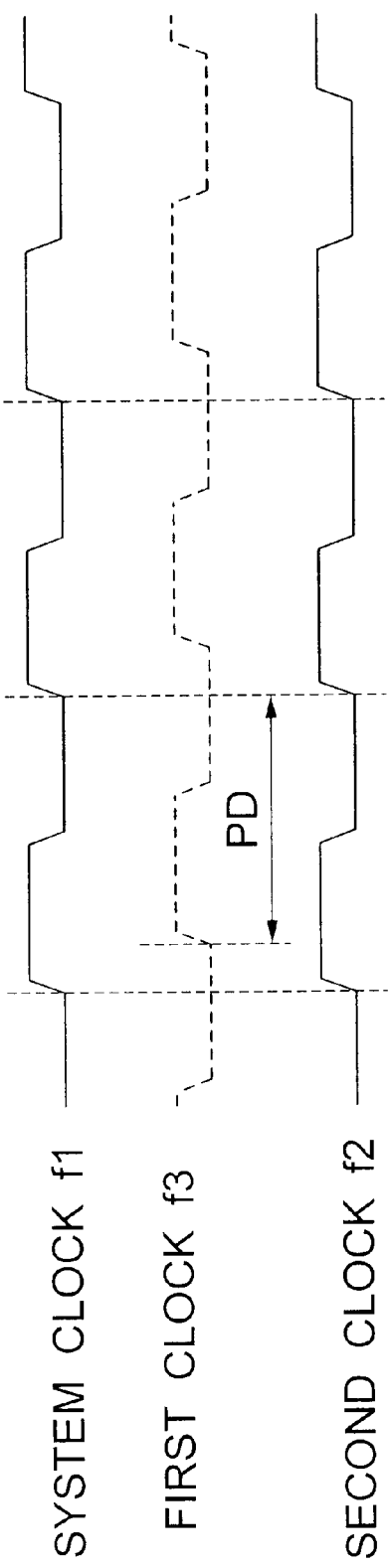
FIG. 5 is a timing chart of the signal processing system of FIG. 4.

The skew adjustment in the present embodiment will be described with reference to FIG. 5. The PLL circuit 13 oscillates for multiplying the frequency of the system clock signal f1 by N (N=1 in this example) to deliver the first clock signal f3 while adjusting the phase of the second clock signal f2 by comparison of the same against the phase of the system clock signal f1 delivered from the system clock generator 17. Thus, the phase of the second clock signal f2 coincides with the phase of the system clock signal f1, as shown in FIG. 5, while allowing the phase of the first clock signal f3 to be deviated significantly from the phases of the system clock signal f1 and the second clock signal f2.

In accordance with the present embodiment, the signal processing system can be handled as a synchronous system while assuming that the system operates with the single system clock signal f1.

Figure 6:
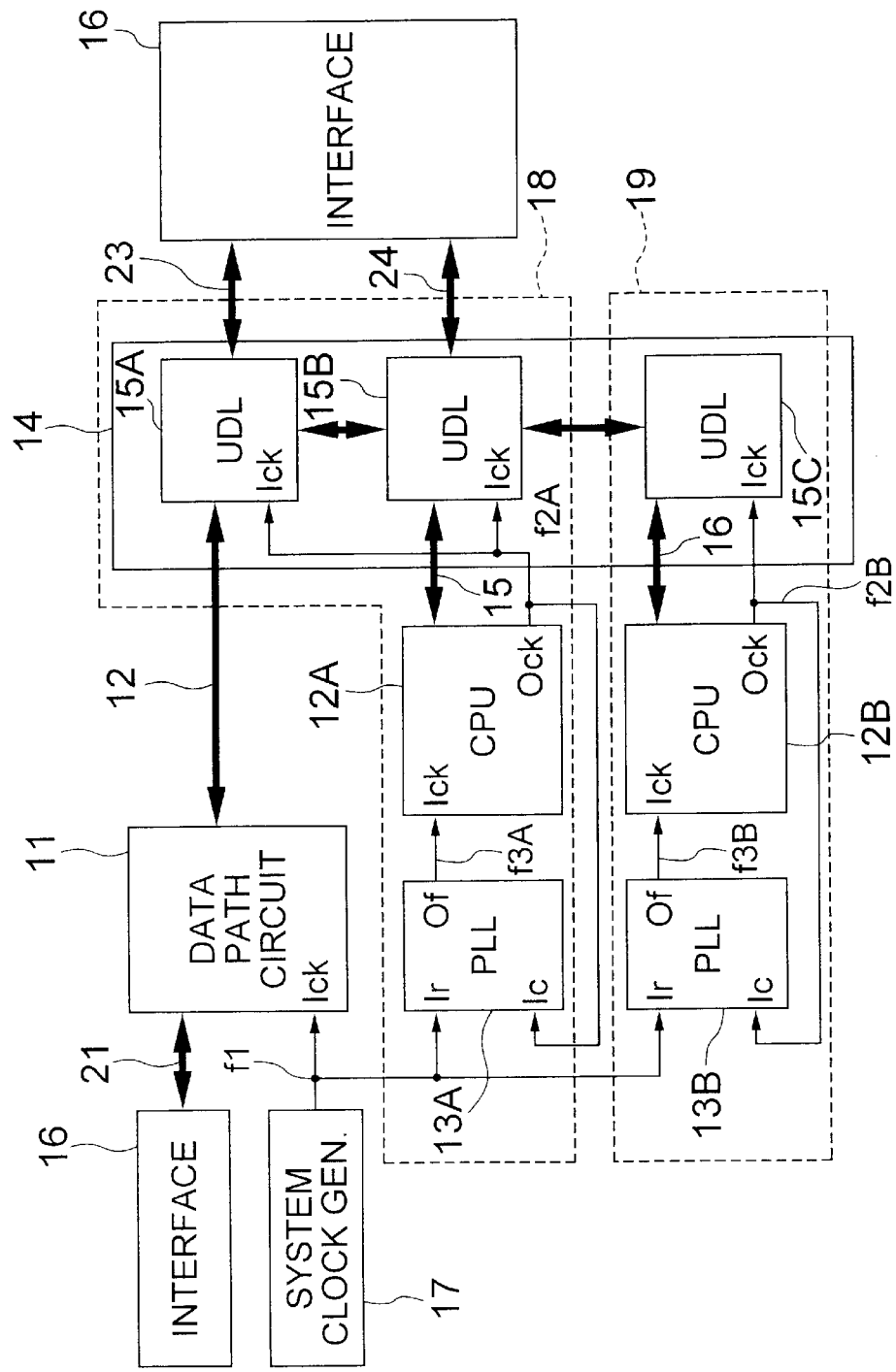
FIG. 6 is a block diagram of a signal processing system according to a second embodiment of the present invention.

Referring to FIG. 6, a signal processing system according to a second embodiment of the present invention is similar to the first embodiment except that an additional combination of a PLL circuit 13B and a CPU 12B is provided in the system and that the UDL block 14 includes three UDL circuits 15A, 15B and 15C each corresponding to one of data path circuit 11, CPU 12A and CPU 12B. The PLL circuit 13A, CPU 12A and UDL circuits 15A and 15B constitute a second processor block 18, and the PLL circuit 13B, CPU 12B and UDL circuit 15C constitute a third processor block 19, with the data path circuit 11 being the first processor block.

Both the CPUs 12A and 12B operate with respective second clock signals $f2_A$ and $f2_B$, the second clock signal $f2_A$ having a frequency which is same as the frequency of the system clock signal f1, the second clock signal $f2_B$ having a frequency which is double the frequency of the system clock signal f1. The phases of both the second clock signals $f2_A$ and $f2_B$ coincide with the phase of the system clock signal f1 due to the feed-back of the second clock signals $f2_A$ and $f2_B$ to the respective PLL circuits 13A and 13B for phase adjustment.

In the present embodiment, due to the phase coincidence between the second clock signals $f2_A$ and $f2_B$, the signal processing system including a plurality of CPUs 12A and 12B operating with different clock signals $f2_A$ and $f2_B$ having different frequencies can be handled as a synchronous circuit which operates with the system clock signal f1.

Since the above embodiments are described only for examples, the present invention is not limited to the above embodiments and various modifications or alterations can be easily made therefrom by those skilled in the art without departing from the scope of the present invention.

What is claimed is:

1. A signal processing system comprising:

a first processing unit for signal processing based on a system clock signal;

a phase-locked loop circuit for generating a first clock signal based on the system clock signal; and a second Processing unit for generating a second clock signal based on the first clock signal and signal processing based on the second clock signal;

a third processing unit for communicating data between the first processing unit, wherein the third processing unit operates based on the second clock signal; and a fourth processing unit for operating with the second clock signal to receive/transmit data between the second processing unit, wherein the phase-locked loop circuit receives the second clock signal as a feedback signal to deliver the first clock signal so that a phase difference between the system clock signal and the second clock signal assumes zero.

2. The signal processing system of claim 1, wherein the first processing unit comprises a video signal sampling circuit for sampling a video signal based on the system clock signal.

3. The signal processing system of claim 1, further comprising:

another phase-locked loop circuit for generating a third clock signal based on the system clock signal, wherein a fifth processing unit generates a fourth clock signal based on the third clock signal, and wherein the another phase-locked loop circuit receives the fourth clock signal as a feed-back signal to deliver the third clock signal so that a phase difference between the system clock signal and the fourth clock signal assumes zero.

4. The signal processing unit of claim 1, wherein the first clock signal and the second clock signal have a significant phase difference therebetween.

5. The signal processing unit of claim 1, wherein the frequency of the first clock signal comprises a multiple of the frequency of the system clock signal.

6. A signal processing system comprising:

a first processing unit for signal processing based on a system clock signal;

a phase-locked loop circuit for generating a first clock signal based on the system clock signal; and a second processing unit for generating a second clock signal based on the first clock signal and signal processing based on the second clock signal; and a third processing unit for communicating data between the first processing unit, wherein the third processing unit operates based on the second clock signal, wherein the phase-locked loop circuit receives the second clock signal as a feedback signal to deliver the first clock signal so that a phase difference between the system clock signal and the second clock signal assumes zero, and wherein the third processing unit comprises:
  a first user data logic unit that operates based upon the second clock signal; and
  a second user data logic unit that operates based upon the second clock signal and that is in communication with the first user data logic unit.

* * * * *